US011776890B2

(12) United States Patent
Maxl et al.

(10) Patent No.: US 11,776,890 B2
(45) Date of Patent: Oct. 3, 2023

(54) POWER SEMICONDUCTOR DEVICE

(71) Applicant: Samsung SDI Co., Ltd., Yongin-si (KR)

(72) Inventors: Florian Maxl, Graz (AT); Markus Pretschuh, Graz (AT); Maximilian Hofer, Hartberg (AT); Peter Kurcik, Sankt Nikolai im Sausal (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 73 days.

(21) Appl. No.: 17/146,785

(22) Filed: Jan. 12, 2021

(65) Prior Publication Data

US 2021/0217693 A1 Jul. 15, 2021

(30) Foreign Application Priority Data

Jan. 13, 2020 (EP) .................................... 20151435
Jan. 8, 2021 (KR) ........................ 10-2021-0002490

(51) Int. Cl.
*H01L 23/498* (2006.01)
*H01L 25/065* (2023.01)
(Continued)

(52) U.S. Cl.
CPC .......... *H01L 23/49844* (2013.01); *B60K 6/28* (2013.01); *B60L 58/10* (2019.02); *H01L 23/36* (2013.01); *H01L 23/367* (2013.01); *H01L 23/373* (2013.01); *H01L 23/492* (2013.01); *H01L 23/4985* (2013.01);
(Continued)

(58) Field of Classification Search
CPC ........... H01L 23/49844; H01L 23/4985; H01L 23/367; H01L 23/5385; H01L 23/36; H01L 23/492; H01L 25/0655; H01L 23/373; B60Y 2200/91; B60Y 2200/92; B60L 50/60

See application file for complete search history.

(56) References Cited

U.S. PATENT DOCUMENTS 3,832,769 A 9/1974 Olyphant, Jr. et al.
2001/0026441 A1* 10/2001 Nakamura .......... H01L 23/3677
361/720

(Continued)

FOREIGN PATENT DOCUMENTS

DE 10 2014 006 841 A1 11/2015
EP 1 429 384 A1 6/2004
(Continued)

OTHER PUBLICATIONS

Extended European Search Report issued in EP 20151435.3 dated Jul. 2, 2020, 8 pages.

*Primary Examiner* — Ahmed N Sefer
(74) *Attorney, Agent, or Firm* — Lewis Roca Rothgerber Christie LLP

(57) ABSTRACT

A power semiconductor device includes: a power semiconductor; a base metal sheet; and a flexible printed circuit board (PCB) between the base metal sheet and the power semiconductor. The power semiconductor includes a first power pad on a side facing the flexible PCB, and the flexible PCB includes a conductive pad, one side of which is electrically connected to the first power pad of the power semiconductor and the opposite side of which is electrically connected to the base metal sheet.

13 Claims, 1 Drawing Sheet

(51) Int. Cl.
*H01L 23/367* (2006.01)
*B60L 58/10* (2019.01)
*B60K 6/28* (2007.10)
*H01L 23/538* (2006.01)
*H01L 23/373* (2006.01)
*H01L 23/36* (2006.01)
*H01L 23/492* (2006.01)

(52) U.S. Cl.
CPC ...... *H01L 23/5385* (2013.01); *H01L 25/0655* (2013.01); *B60Y 2200/91* (2013.01); *B60Y 2200/92* (2013.01)

(56) References Cited

U.S. PATENT DOCUMENTS

| | | | |
|---|---|---|---|
| 2002/0173192 | A1 | 11/2002 | Heilbronner |
| 2014/0312486 | A1* | 10/2014 | Lee ................ H01L 23/36 257/713 |
| 2015/0091152 | A1* | 4/2015 | Jo ................... H05K 1/09 174/251 |
| 2017/0094790 | A1* | 3/2017 | Tazarine ............ F02N 11/087 |
| 2019/0101091 | A1* | 4/2019 | Baxendale ......... F02N 11/087 |
| 2019/0363051 | A1* | 11/2019 | Jung ................ H01L 23/3675 |
| 2021/0360788 | A1* | 11/2021 | Kratzer .............. H05K 1/0212 |

FOREIGN PATENT DOCUMENTS

| | | | | |
|---|---|---|---|---|
| WO | WO 2013/038749 A1 | 3/2013 | | |
| WO | WO-2020088868 A1 * | 5/2020 | ........... | H01L 25/072 |

\* cited by examiner

POWER SEMICONDUCTOR DEVICE

CROSS-REFERENCE TO RELATED APPLICATION

This application claims priority to and the benefit of European Patent Application No. 20151435.3, filed in the European Patent Office on Jan. 13, 2020, and Korean Patent Application No. 10-2021-0002490, filed in the Korean Patent Office on Jan. 8, 2021, the entire content of both of which is incorporated herein by reference.

BACKGROUND

1. Field

Aspects of embodiments of the present disclosure relate to a power semiconductor device.

2. Related Art

In recent years, vehicles using electric power as a source of motion have been developed. An electric vehicle is an automobile that is powered by an electric motor using energy stored in rechargeable batteries. An electric vehicle may be powered solely by batteries or may be a hybrid vehicle powered by, for example, a gasoline generator. Furthermore, the vehicle may include a combination of an electric motor and a conventional combustion engine.

Generally, an electric-vehicle battery (EVB), or traction battery, is a battery used to power the propulsion of battery electric vehicles (BEVs). Electric-vehicle batteries differ from starting, lighting, and ignition batteries because they are designed to provide (or output) power over sustained periods of time. A rechargeable (or secondary) battery differs from a primary battery in that it is designed to be repeatedly charged and discharged, while the latter is designed to provide an irreversible conversion of chemical to electrical energy. Low-capacity rechargeable batteries may be used as power supply for small electronic devices, such as cellular phones, notebook computers, and camcorders, while high-capacity rechargeable batteries may be used as the power supply for hybrid vehicles and the like.

Rechargeable batteries may be used as (or included in) a battery module including a plurality of unit battery cells (also referred to herein as "cells") coupled to each other in series and/or in parallel to provide a high energy density for, as an example, motor driving of a hybrid vehicle. A battery module may be formed by interconnecting electrode terminals of the unit battery cells, the number of which depends on a desired amount of power, to realize a high-power rechargeable battery. The cells can be connected to each other in series, parallel, or in a mixture of both to provide the desired voltage, capacity, and/or power density. Battery packs may include a plurality of individual battery modules and interconnects, which provide electrical conductivity between the battery modules.

A static control of battery power output and charging may not be sufficient to meet the dynamic power demands of various electrical consumers connected to the battery system. Thus, information may be steadily exchanged between the battery system and the controllers of the electrical consumers. This information includes, for example, the battery system's actual state of charge (SoC), potential electrical performance, charging ability, and internal resistance as well as the consumers' actual or predicted power demands or surpluses.

Battery systems usually include a battery control unit, often referred to as battery management unit (BMU) and/or a battery management system (BMS), for processing the aforementioned information. The battery control unit may include controllers of the various electrical consumers and may include suitable internal communication busses (e.g., a SPI or CAN interface). The battery control unit may communicate with each of the battery submodules, for example, with a cell supervision circuit (CSC) of each battery submodule. The CSC may be further connected to a cell connection and sensing unit (CCU) of the corresponding battery submodule that interconnects the battery cells of the battery submodule. Thus, the battery control unit may be provided to manage the battery pack, such as by protecting the battery from operating outside its safe operating area, monitoring its state, calculating secondary data, reporting that data, controlling its environment, and authenticating and/or balancing it. Generally, the battery control unit may control a relay to a load and may switch the load in various fault situations.

Battery systems for vehicles are high-voltage applications (e.g., high-voltage implementations), such that heat is generated in various current-conducting semiconductor devices due to resistive loss. Therefore, semiconductor devices, for example, power MOSFETs, may require cooling techniques that remove the heat away from the device to prevent performance drops or defects due to overheating.

Conventionally, power MOSFETs or other power semiconductor devices are mounted on a rigid printed circuit board (PCB), which may include a relatively large number of thermally conductive vertical interconnect access (VIAs) to direct heat flow away from the device and toward a sink. Conventional devices to cool the power semiconductor devices, such as MOSFETs, are expensive and/or require a rather complex design for the PCB, which is further accompanied with intricate connections to electrically connect the device.

SUMMARY

Embodiments of the present disclosure provide a power semiconductor device and a battery system including the power semiconductor device. Another embodiment of the present disclosure provides a vehicle including the battery system.

According to one embodiment of the present disclosure, a power semiconductor device for a vehicle is provided including a power semiconductor and a base metal sheet. The power semiconductor device may include a flexible printed circuit board (PCB) positioned between the base metal sheet and the power semiconductor. Throughout this disclosure, "positioned between" may be referred to as "sandwiched between." The power semiconductor includes a first power pad on a side facing the flexible PCB. The flexible PCB includes an electrically conductive pad. One side of the conductive pad is electrically connected to the first power pad of the semiconductor, and the opposite side of the pad is electrically connected to the base metal sheet.

The power semiconductor may be a semiconductor suitable for high-voltage applications, such as for use in vehicles. Applied voltages may have an order of magnitude of, for example, about 12 volt, 24 volt, 48 volt, or more, with electric currents on the magnitude of about 1 ampere, but the present disclosure is not limited thereto. A power semiconductor according to the present disclosure may be, for example, a diode or a transistor. In some embodiments, the power semiconductor may be a field-effect transistor, such as a MOSFET. The base metal sheet may be electrically contacted to measure or to supply a voltage to the first power pad.

For example, the conductive pad of the flexible PCB may be a conductive portion of a conductive layer of the flexible PCB, with its main side electrically contacting the first power pad and its opposite main side contacting the metal sheet. Each main side of the conductive pad or portion may be, for example, laid open to form the electrical contact.

The flexible printed circuit board according to embodiments of the present disclosure has a higher thermal conductivity than rigid counterparts. Thermally conductive VIAs may be omitted due to the high thermal conductivity of the flexible PCB. The material of the flexible PCB may be, for example, a polyimide or a polyetheretherketone, but the present disclosure is not limited thereto. Heat produced in the power semiconductor device can be readily carried away through the flexible PCB, without the need of VIAs, and through the base metal sheet in a vertical direction to improve the cooling performance and to reduce local overheating. Cost reduction is achieved compared to conventional rigid PCBs. In addition, the semiconductor device can be wire-connected through the flexible PCB.

The power semiconductor may include a second power pad on a side facing away from the flexible PCB and may further include a top metal sheet electrically connected to the second power pad of the power semiconductor to provide easy contacting to the second power pad.

A height of the flexible PCB may be less than about 100 μm, less than about 70 μm, or less than about 40 μm. When the height of the flexible PCB is less than about 100 μm, and more so as the height of the flexible PCB further decreases, the thermal resistance in a vertical direction may be reduced and the amount of heat that can be efficiently carried away without the need of a large number of VIAs is increased.

The flexible PCB may be a one-layer (e.g., a single-layer) flexible PCB including one conductive layer, and the conductive layer may include the conductive pad. A one-layer PCB, compared to two-layer PCB or multi-layer PCB, has further reduced thermal resistance in the vertical direction.

The power semiconductor may be soldered on one side of the flexible PCB, the base metal sheet may be soldered on the other side of the flexible PCB, and/or the top metal sheet may be soldered onto the power semiconductor. The soldering provides a structurally stable electrically conductive connection.

The semiconductor may be a field-effect transistor, further including a gate power pad, and the gate power pad may be positioned on the side of the semiconductor facing the flexible PCB. The first power pad may be a power drain pad, and the second power pad may be a power source pad. Field-effect transistors may be used in various vehicle applications. For example, a field-effect transistor may be used in place of a relay to switch off a load in case of a detected (or determined) fault in the battery system. When the gate power pad is positioned as described, it can be readily connected via conductive tracks within the flexible PCB, and a cumbersome connection implementation can be avoided.

The flexible PCB may have a protruding section, which protrudes from the power semiconductor, from the base metal sheet, and/or from the top metal sheet in a plan view. For example, the protruding section does not overlap the power semiconductor, the base metal sheet, and/or the top metal sheet in a plan view. The protruding section may allow for externally contacting the gate pad.

The flexible PCB may include a conductive track electrically connecting the gate power pad to a gate connector for an external contact, and the gate connector may be positioned in the protruding section of the flexible PCB. Throughout this disclosure, "conductive tracks" may be referred to as "conductive lines." Such breaking out of the gate connector simplifies the connection to the gate power pad, and costs for elaborate connections are avoided and compactness may be improved.

The base metal sheet and/or the top metal sheet may include (or may be made of) copper, and the base and/or the top metal sheet may include a connector for external contact. Copper has high electric conductivity. The connectors on the metal sheets allow direct contact between the pads of the semiconductor and may also function as common source for more than one semiconductor.

The power semiconductor device may include a plurality of power semiconductors. For example, the number of power semiconductors may be 2, 4, 6, 7, 8, 10, or more, but the present disclosure is not limited thereto.

The power semiconductor device may include a first subset and a second subset of power semiconductors, and each conductive pad of the first subset of power semiconductors is electrically isolated from each electrically conductive pad of the second subset in the flexible PCB. Thus, the power pads of the different subsets may have different potentials.

The base metal sheet may include a first base metal sheet and second base metal sheet, each base metal sheet may be electrically isolated from each other, each electrically conductive pad of the first subset of semiconductors may be electrically connected to a first power pad of the first subset of semiconductors and to the first base metal sheet, and each electrically conductive pad of the second subset of semiconductors may be electrically connected to a first power pad of the second subset of semiconductors and to the second base metal sheet. The first power pads of the same subset may be commonly contacted via the first base metal sheet, and the first power pads of the second subset may then be commonly contacted via the second base metal sheets.

The power semiconductor device may include a heat sink attached on the side of the base metal sheet facing away of the flexible PCB. Heat generated by the device can then be readily transported via the flexible PCB and through its highly conductive material and the base metal sheet without the requirement of VIAs.

According to another embodiment of the present disclosure, a battery system is disclosed including a battery control unit electrically connected to the power semiconductor device of one of the above-described embodiments and, the battery control unit is configured to control the power semiconductor device. The battery control unit may be electrically connected to the connectors of the metal sheets and the gate connector.

According to yet another embodiment, a vehicle including a battery system according to one of the above-described embodiments is disclosed.

BRIEF DESCRIPTION OF THE DRAWINGS

Aspects and features of the present disclosure will become apparent to those of ordinary skill in the art by describing, in detail, exemplary embodiments of the present disclosure with reference to the attached drawings in which.

DETAILED DESCRIPTION

Figure 1:
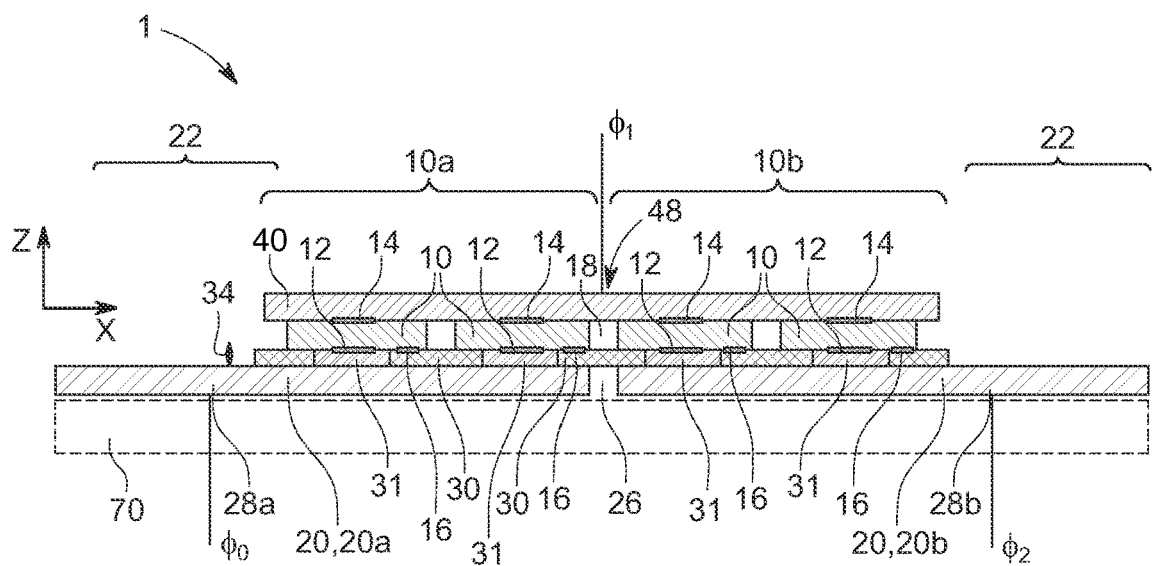
FIG. 1 is a schematic side view of a semiconductor device according to an embodiment of the present disclosure.

Reference will now be made, in detail, to embodiments, examples of which are illustrated in the accompanying drawings. Aspects and features of the exemplary embodiments, and implementation methods thereof, will be described with reference to the accompanying drawings. In the drawings, like reference numerals denote like elements, and redundant descriptions thereof may be omitted. As used herein, the term "and/or" includes any and all combinations of one or more of the associated listed items. Further, the use of "may" when describing embodiments of the present disclosure refers to "one or more embodiments of the present disclosure."

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms "first" and "second" are used to describe various features, these features should not be limited by these terms. These terms are used to distinguish one element from another element. For example, a first element may be named a second element and, similarly, a second element may be named a first element, without departing from the scope of the present disclosure.

It will be further understood that the terms "has," "include," "comprise," "having," "including," or "comprising" specify a property, a region, a fixed number, a step, a process, an element, a component, and a combination thereof but do not exclude other properties, regions, fixed numbers, steps, processes, elements, components, and combinations thereof.

In the drawings, the sizes of elements may be exaggerated for clarity. For example, in the drawings, the size or height of each element may be arbitrarily shown for illustrative purposes, and thus, the embodiments of the present disclosure should not be construed as being limited thereto.

Spatially relative terms, such as "beneath," "below," "lower," "under," "above," "upper," and the like, may be used herein for ease of explanation to describe one element or feature's relationship to another element(s) or feature(s) as illustrated in the figures. Herein, the terms "upper" and "lower" are defined according to the z-axis in the drawings. For example, the upper cover is positioned at the upper part of the z-axis, whereas the lower cover is positioned at the lower part thereof. Nevertheless, it will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
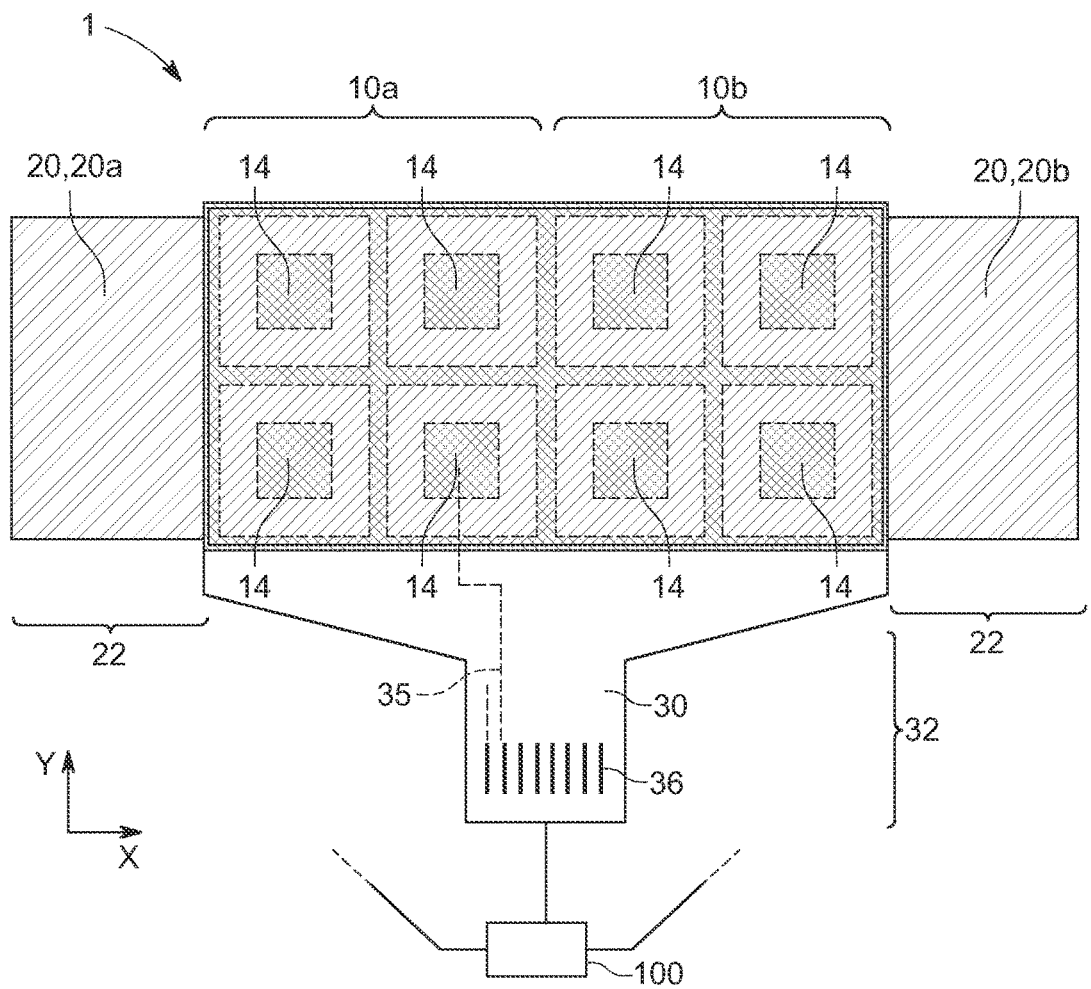
FIG. 2 is a top view of a semiconductor device according an embodiment and a battery system according to an embodiment of the present disclosure.

FIG. 1 shows a power semiconductor device 1 for a vehicle according to an exemplary embodiment of the present disclosure in side view perspective. Herein, the z-axis refers to a vertical direction, and the x-axis refers to a planar direction as shown in the illustrated coordinate system. FIG. 2, described in more detail below, shows the power semiconductor device 1 in plan view on the x-y plane. The power semiconductor device 1 includes a power semiconductor (e.g., a semiconductor) 10. In the side view of FIG. 1, four different power semiconductors 10 are shown, but the present disclosure is not limited thereto. Other embodiments of the present disclosure may include, for example, 1, 2, 6, 7, 8, 10, or more semiconductors 10. The power semiconductor device 1 further includes a base metal sheet 20. The base metal sheet 20 may be two-parted (e.g., may have two parts or portions) with a first base metal sheet 20*a* and a second base metal sheet 20*b*, described in more detail below. Embodiments of the present disclosure may also include a one-piece base metal sheet 20.

The power semiconductor device 1 further includes a flexible printed circuit board (PCB) 30. The flexible PCB 30 is positioned between the base metal sheet 20 and the power semiconductor(s) 10. Each power semiconductor 10 includes a first power pad 12 on a side facing the flexible PCB 30.

The flexible PCB 30 further includes an electrically conductive pad 31. For example, the conductive pad 31 may be a conductive portion in a conductive layer of the flexible PCB 30, for example, laid open on its both main sides to provide electrical contact. One side of that conductive pad 31 is electrically connected to the first power pad 12 of the semiconductor 10, and the opposite side of the pad 31 is electrically connected to the base metal sheet 20, 20*a*, 20*b*.

The conductive pad 31 thus electrically connects the first power pad 12 through the flexible PCB 30 to the metal sheet 20, 20a, 20b having equal electrical potential.

Embodiments of the present disclosure allows for thermally conductive VIAs, often used in rigid PCBs, may be omitted due to the high thermal conductivity of the flexible PCB 30. Heat produced in the power semiconductor device 1 can be readily carried away through the flexible PCB 30 itself, without thermal VIAs, and through the base metal sheet 20 in a vertical direction. Thus, cooling performance is improved and local overheating avoided in simple way. The flexible PCB 30 may include (or may be) polyimide or a polyetheretherketone, but the present disclosure is not limited thereto.

In the illustrated embodiment, a heat sink 70 is positioned on the side of the base metal sheet 20 facing away from the flexible PCB 30 and may be attached thereto. Heat produced in the power semiconductor 10 may be conducted vertically through the flexible PCB 30 and the first base metal sheet 20 to the heat sink 70.

The height (e.g., thickness) 34 of the flexible PCB 30 may be less than about 100 μm. In other embodiments, the height 34 may be less than about 70 μm or less than about 40 μm. When the height 34 is less than the threshold value of about 100 μm, the thermal resistance of the flexible PCB 30 is substantially lower than that of rigid PCBs. Heat is then readily transported (or transmitted) through the flexible PCB 30. Heat transmission through the flexible PCB 30 is further improved when the height 34 is less than about 70 μm or less than about 40 μm.

To further improve the reduction of thermal resistance, the flexible PCB 30 may be a one-layer flexible PCB. The conductive layer of the flexible PCB 30 includes the conductive pad 31, which is schematically shown in FIG. 1. Compared to two-layer flexible PCBs or multi-layered flexible PCBs, the thermal conductivity of one-layer flexible PCBs is improved such that heat is effectively transported away from the power semiconductor 10 to the heat sink 70.

The power semiconductor 10, in the illustrated embodiment, includes a second power pad 14 on a side facing away from the flexible PCB 30. The power semiconductor device 1 may further include a top metal sheet 40 electrically connected to the second power pad 14 of the semiconductor 10.

A power diode may be formed in this manner. Furthermore, the metal sheets 20, 20a, 20b, 40 may include, as shown in FIG. 1, a connector 28a, 28b, 48 for external contact. Here, two connectors 28a, 28b are provided for the two-part base metal sheet 20a, 20b. In other embodiments, the base metal sheet 20 may be one-parted (e.g., may include a single base metal sheet 20) and, in such an embodiment, only one connector (e.g., a common connector) would be necessary. The locations of the connectors 28a, 28b, 48 on the metal sheets 20a, 20b are exemplary shown, and a person skilled in the art would find suitable locations for the connectors 28a, 28b, 48.

The base metal sheet 20 and/or the top metal sheet 40 may include (or may be made of) copper, which provides high electric conductivity, but the present disclosure is not limited thereto. For example, in the illustrated embodiment, the top metal sheet 40 is electrically connected to each of the second power pads 14 of the power semiconductors 10. For example, the electrical potential (pi at the top connector 40 coincides with each potential of the second power pads 14 of the semiconductors 10. The second power pad 14, as shown in FIGS. 1 and 2, may be configured as an exposed pad 14 on the top side of the power semiconductor 10.

The power semiconductor 10 may be soldered on one side of the flexible PCB 30, and the base metal sheet 20 may be soldered on the other side of the flexible PCB 30. Soldering may be used to electrically connect and fasten the metal sheets 20a, 20b, 40 or the power semiconductor 10 to the flexible PCB 30. Also, the top metal sheet 40 may be soldered onto the power semiconductor 10.

In the illustrated embodiment, the power semiconductor 10 is a field-effect transistor, such as a MOSFET transistor. The field-effect transistor further includes a gate power pad 16. The gate power pad 16 may be positioned, as can be seen in FIG. 1, on the side of the semiconductor 10 facing the flexible PCB 30. The first power pad 12 may be a power drain pad, and the second power pad 14 may be a power source pad. The field-effect transistor may act as a switch in a battery system to switch a load in case of a detected fault.

The power semiconductor device 1 may include a plurality of power semiconductors 10. For example, the number of power semiconductors is 4 or 8, with 4 being visible in FIGS. 1 and 8 being visible in FIG. 2, but the present disclosure is not limited thereto, and the number of semiconductors may be 1, 2, 6, 12, or more. The power semiconductors 10 may be arranged in a line, a double-line as shown in FIG. 2, or more generally in a matrix format. These power semiconductors 10 may be spatially distanced from each other. For example, an air gap 18 may be provided between each power semiconductor 10 to avoid interference.

As can be seen in the example embodiment shown in FIG. 2, the power semiconductor device 1 may include a first subset 10a of power semiconductors 10 and a second subset 10b of power semiconductors 10. Each conductive pad 31 of the first subset 10a of power semiconductors 10 is electrically isolated from each conductive pad 31 of the second subset 10b on the flexible PCB 30. Thus, the conductive pads 31 and the connected first power pads 12 of different subsets 10a, 10b may have different electrical potentials.

The base metal sheet 20 may include a first base metal sheet 20a and a second base metal sheet 20b. Each base metal sheet 20a, 20b may be electrically isolated from each other. For example, as shown in FIG. 1, an air gap 26 may be between the two base metal sheets 20a, 20b to separate the base metal sheets 20a, 20b.

The electrically conductive pad 31 of the first subset 10a of power semiconductors 10 may be electrically connected to the first power pad 12 of the first subset 10a of power semiconductors 10 and to the first base metal sheet 20a. The electrically conductive pad 31 of the second subset 10b of power semiconductors 10 may be electrically connected to the first power pad 12 of the second subset 10b of power semiconductors 10 and with the second base metal sheet 20b.

In such an embodiment, the first base metal sheet 20a and the corresponding first power pads 12 may have a different potential as the second base metal sheet 20b. For example, a connector 28a of the first metal sheet 20a may have an electrical potential $\varphi_0$, the connector 48 of the top metal sheet 40 may have an electrical potential $\varphi_1$, and the connector 28b of the second metal sheet 20b may have an electrical potential $\varphi_2$. Each of the potentials can be different from each other.

When the gate power pad 16 is supplied with a voltage above a reference (or threshold) voltage, an electrical current may flow from the first base metal sheet 20a to the second base metal sheet 20b through the first subset 10a of power semiconductors 10, the top metal sheet 40, the second subset 10b of power semiconductors 10 in the case of $\varphi_0 > \varphi_1 > \varphi_2$ or vice versa. The current may be a charging current or a discharging current of a battery system to charge or discharge the battery cells of a battery stack.

In other embodiments, when only a single base metal sheet 20 is provided, an electric current may flow from the base metal sheet 20 to the top metal sheet 40 through the power semiconductors 10 based on the gate voltage in case of a transistor and the respective electrical potentials.

The power semiconductors described herein may be used in an embodiment of a battery system where, instead of a common relay, a switch transistor with the above described features is used to switch a load in case of a detected fault situation.

FIG. 2 shows the power semiconductor device 1 shown in FIG. 1 in a plan view perspective. Features already described above with respect to FIG. 1 may not be repeated for the sake of conciseness.

In the illustrated embodiment, the flexible PCB 30 has a protruding section 32, which protrudes from the power semiconductors 10, from the base metal sheet 20, and the top metal sheet 40 in a plan view. In other embodiments, the protruding section 32 may protrude from at least one of the power semiconductors 10, from the base metal sheet 20, and the top metal sheet 40 in a plan view.

The flexible PCB 30 may further include, as can be seen in FIG. 2, at least one conductive track 35 electrically connecting a gate power pad 16 of the power semiconductor 10 to a gate connector 36 for external contact. As an example, one of the conductive tracks 35 is shown leading to a gate pad. The gate connector 36 in the illustrated embodiment is positioned in the protruding section 32 of the flexible PCB 30. Thereby, the gate connector 36 is broken out and provides simplified connection to externally contact the gate power pad 16. Via the protruded section 32 with gate connector 36 combined with the flexible material property of the protruded section 32, positioning and integration of the power semiconductor device 1 in larger systems may be improved.

Further, the base metal sheet 20 may also have a protruding section 22 which protrudes from the flexible PCB 30, the semiconductors 10, and the top metal sheet 40, and the protruding direction may be substantially perpendicular to the protruding direction of the protruding section 32 of the flexible PCB 30. In another embodiment, the connectors 28a, 28b may be positioned in the protruding section 22 to improve the convenience of an external contact to the first power pad 12.

Further, a battery control (or management) unit 100 may be electrically connected to the power semiconductor device 1. The battery control unit 100 may control the power semiconductor device 1. For example, when the power semiconductor device 1 is a field-effect transistor, such as a MOSFET, the battery system may utilize the field-effect transistor as a switching transistor to switch a load. The battery control unit 100 may be configured to switch the field-effect transistor off in case of a detected fault.

The battery control unit 100 is electrically connected to the gate connector 36 of the power semiconductor device 1. The gate connector 36 may be a common connector to control the gate of each of the power semiconductors 10 at once, when a plurality of power semiconductors 10 is present. Additionally, the battery control unit 100 may be electrically connected to the connector 48 of the top metal sheet 40 and/or with the connectors 28a, 28b of the base metal sheet 20 for monitoring or supplying voltage.

In other embodiments, when the power semiconductor device is not a transistor, only electrical connection with the connector 48 of the top metal sheet 40 and/or with the connectors 28a, 28b of the base metal sheet 20 may be present.

Additionally, a vehicle is disclosed, which may include a battery system according to the above-described embodiments.

SOME REFERENCE NUMERALS 1 power semiconductor device
10 power semiconductor
10a first subset
10b second subset
12 first power pad
14 second power pad
16 gate power pad
18 gap
20 base metal sheet
20a first base metal sheet
20b second base metal sheet
22 protruding section
26 gap
28a connector
28b connector
30 flexible printed circuit board (PCB)
31 pad
32 protruding section
34 height
35 conductive track
36 gate connector
40 top metal sheet
48 connector
70 heat sink
100 battery control system

What is claimed is:

1. A power semiconductor device for a vehicle, the power semiconductor device comprising:
    a plurality of power semiconductors arranged in a first subset of power semiconductors and a second subset of power semiconductors;
    a base metal sheet comprising a first base metal sheet and second base metal sheet, each of the first and second base metal sheets being electrically isolated from each other;
    a one-layer flexible printed circuit board (PCB) comprising one conductive layer and being between the base metal sheet and the power semiconductors; and
    a top metal sheet,
    wherein each of the power semiconductors comprises a first power pad on a side facing the flexible PCB,
    wherein the conductive layer of the flexible PCB comprises a plurality of conductive pads,
    wherein one side of a first one of the conductive pads is electrically connected to the first power pad of one of the power semiconductors in the first subset of power semiconductors and the opposite side of the first one of the conductive pads is electrically connected to the first base metal sheet,
    wherein one side of a second one of the conductive pads is electrically connected to the first power pad of one of the power semiconductors in the second subset of power semiconductors and the opposite side of the second one of the conductive pads is electrically connected to the second base metal sheet,
    wherein each of the power semiconductors comprises a second power pad on a side facing away from the flexible PCB, and wherein the top metal sheet is electrically connected to the second power pad of the power semiconductors.

2. The power semiconductor device of claim 1, wherein a height of the flexible PCB is less than 100 μm.

3. The power semiconductor device of claim 1, wherein the power semiconductors are soldered on one side of the flexible PCB, and the base metal sheet is soldered on an opposite side of the flexible PCB, and/or the top metal sheet is soldered on the side of the power semiconductors facing away from the flexible PCB.

4. The power semiconductor device of claim 3, wherein the power semiconductors are field-effect transistors and further comprise a gate power pad,
wherein the gate power pad positioned on the side of the power semiconductors facing the flexible PCB, and
wherein the first power pad is a power drain pad, and the second power pad is a power source pad.

5. The power semiconductor device of claim 4, wherein the flexible PCB has a protruding section protruding from the power semiconductors, from the base metal sheet, and/or the top metal sheet in a plan view.

6. The power semiconductor device of claim 5, wherein the flexible PCB further comprises a conductive track electrically connecting the gate power pad to a gate connector for external contact, and
wherein the gate connector is arranged in the protruding section of the flexible PCB.

7. The power semiconductor device of claim 1, wherein the base metal sheet and/or the top metal sheet comprises copper, and
wherein the base metal sheet and/or the top metal sheet comprise a connector for external contact.

8. The power semiconductor device of claim 1,
wherein each of the conductive pads of the flexible PCB connected to the power semiconductors in the first subset of power semiconductors is electrically isolated from each of the conductive pads of the flexible PCB connected to the power semiconductors in the second subset of power semiconductors.

9. The power semiconductor device of claim 8,
wherein each of the conductive pads of the flexible PCB connected to the power semiconductors in the first subset of power semiconductors is electrically connected to the first power pad of the power semiconductors in the first subset of power semiconductors and to the first base metal sheet, and
wherein each of the conductive pads of the flexible PCB connected to the power semiconductors in the second subset of power semiconductors is electrically connected to the first power pad of the power semiconductors in the second subset of power semiconductors and to the second base metal sheet.

10. The power semiconductor device of claim 1, further comprising a heat sink on a side of the base metal sheet facing away from the flexible PCB.

11. A battery system comprising a battery control unit electrically connected to the power semiconductor device of claim 1,
wherein the battery control unit is configured to control the power semiconductor device.

12. A vehicle comprising a battery system according to claim 11.

13. The power semiconductor device of claim 1, wherein the first base metal sheet and the second base metal sheet are separated by a gap, and
wherein the flexible PCB extends over the gap.

* * * * *